United States Patent
Ulrich

(10) Patent No.: US 10,699,880 B2
(45) Date of Patent: Jun. 30, 2020

(54) VOLTAGE REDUCTION CIRCUIT

(71) Applicant: Reno Technologies, Inc., Wilmiington, DE (US)

(72) Inventor: Michael Gilliam Ulrich, Delanco, NJ (US)

(73) Assignee: RENO TECHNOLOGIES, INC., Wilmington, DE (US)

( * ) Notice: Subject to any disclaimer, the term of this patent is extended or adjusted under 35 U.S.C. 154(b) by 45 days.

(21) Appl. No.: 15/196,821

(22) Filed: Jun. 29, 2016

(65) Prior Publication Data

US 2016/0380610 A1 Dec. 29, 2016

Related U.S. Application Data

(60) Provisional application No. 62/185,998, filed on Jun. 29, 2015.

(51) Int. Cl.
*H01J 37/32* (2006.01)
*H03H 7/38* (2006.01)

(52) U.S. Cl.
CPC .. *H01J 37/32183* (2013.01); *H01J 37/32174* (2013.01); *H03H 7/38* (2013.01)

(58) Field of Classification Search
CPC .............................. H01J 37/32183; H03H 7/38
USPC ............................................................ 333/32
See application file for complete search history.

(56) References Cited

U.S. PATENT DOCUMENTS

| | | | |
|---|---|---|---|
| 3,681,672 A † | 8/1972 | Strauss | |
| 4,679,007 A † | 7/1987 | Reese | |
| 4,763,087 A † | 8/1988 | Schrader | |
| 6,642,661 B2 † | 11/2003 | Strang | |
| 8,207,798 B1 * | 6/2012 | Wright | H03F 1/565 333/17.3 |
| 8,436,643 B2 † | 5/2013 | Mason | |
| 9,306,533 B1 * | 4/2016 | Mavretic | H03H 7/40 |
| 2009/0066438 A1 * | 3/2009 | Kim | H03H 7/40 333/17.3 |
| 2012/0075033 A1 * | 3/2012 | Ouyang | H01J 37/32183 333/32 |
| 2013/0193867 A1 * | 8/2013 | Van Zyl | H01J 37/32183 315/240 |

OTHER PUBLICATIONS

Rudolf F. Graf, Modern Dictionary of Electronics—Seventh Edition, pp. 95-96, 1999, Butterworth-Heinemann, Massachusetts.†

* cited by examiner
† cited by third party

*Primary Examiner* — Samuel S Outten
(74) *Attorney, Agent, or Firm* — The Belles Group, P.C.

(57) ABSTRACT

In one embodiment, the invention can be an impedance matching network including an input configured to operably couple to a radio frequency (RF) source; an output configured to operably couple to a load; a first variable capacitor; a second variable capacitor; and a third capacitor in series with the second variable capacitor and reducing a voltage on the second variable capacitor.

19 Claims, 8 Drawing Sheets

VOLTAGE REDUCTION CIRCUIT

CROSS REFERENCE TO RELATED APPLICATIONS

The present application claims the benefit of U.S. Provisional Patent Application No. 62/185,998 filed on Jun. 29, 2015, which is incorporated herein by reference.

BACKGROUND

Variable capacitors are used in many applications, such as matching networks and variable filters. They allow for the precise tuning, after assembly, of frequency and/or impedance in applications needing a dynamic system response, such as in plasma processes. The ability to dynamically change impedance and frequency response provides more flexibility for the applications variable capacitors are used in, and can compensate for variations from unit-to-unit. Some examples of variable capacitors are vacuum variable capacitors (VVCs) and electronically variable capacitors (EVCs).

In electronic circuits, matching networks are used to match the source impedance to the load impedance and vice versa. That is, the source, being of some impedance with a resistive part and a reactive part, will be terminated into the complex conjugate impedance, and the load impedance will be driven by the complex conjugate of its impedance. The complex conjugate is used to eliminate the reactive part of the impedance, leaving only the resistive part, and the resistive part is made equal. This is done so that maximum power transfer can be achieved at the load.

In plasma applications, the load impedance can vary depending on several factors, such as time, power level, pressure, gas flow, chemistry of the gasses, and whether the plasma has been struck. Accordingly, the matching network must be able to automatically vary itself to ensure that the maximum power transfer is achieved. This helps with repeatability in both the depositing and etching.

An inherent issue that arises with matching networks is that very high voltages can be generated internal to the network. Such voltages can negatively affect the internal components of the matching circuit. For example, the capacitors in the circuit can be damaged or destroyed from overvoltage, rendering the circuit ineffective and useless. Previous solutions to this issue have led to either increased component sizes or increases in the number of peripheral components.

VVCs typically use cylindrical or spiral plates that are inter-wound. The vacuum is used as the dielectric. To change capacitance, one set of electrodes is moved in or out of the other set, which changes the amount of overlap, which changes the capacitance. The most basic calculation for capacitance can be seen in the following equation, where C is capacitance, $\mu_0$ is the permittivity of free space, A is the overlapping area, and d is the distance between plates.

$$C = \frac{\mu_0 A}{d}$$

As the overlapping area increases or decreases as the one electrode is moved in and out, the capacitance will increase or decrease respectively.

As voltages increase in variable capacitors, the potential for a voltage breakdown occurs. To overcome this issue, the distance between the electrodes is increased. This increase in distance will increase the size of the part. It will also reduce the capacitance proportionately to the distance. This requires the amount of windings to be increased so that area per distance is kept constant. Adding more windings again increases the size of the part and also adds to the cost.

EVCs use switches to add or remove fixed capacitors, such as an MLCC (multi-layer ceramic capacitor), in a circuit. The capacitor and switch are placed in series. This circuit is then placed in parallel with other capacitor/switch circuits. The parallel circuits allow the capacitors to be simply added or subtracted in the circuit, depending on how many switches are opened or closed. In the case where all the switches are open, the EVC will be at its lowest capacitance value. In the case where they are all closed, the EVC will be at its highest capacitance value.

Typically, the switch is the limiting factor in an EVC. The amount of voltage that the switch is capable of withstanding before dielectric breakdown occurs depends upon the type of switch (e.g., a PIN Diode, a Transistor, or a FET) and the switch's properties. Traditionally, to handle high voltages, more switches would be added in series to increase the breakdown voltage of the circuit. For example, if two switches are placed in series, the breakdown voltage is doubled. There are also other components that are needed to switch the device, and the circuit may become more complex with the added switches. All of these peripherals, extra switches and components, to the EVC's fixed capacitor, add to the costs and size of the EVC.

Thus, whether the variable capacitor in a matching network is a VVC or an EVC, there is need for a matching network that can more effectively handle high voltages generated in the network. There is further need for a solution that avoids or minimizes the need for increased component sizes (as typically required for a VVC) or increased numbers of peripheral components (as typically required with an EVC). There is further need for a solution that has a lower cost than previous methods of addressing high voltages in a matching network.

BRIEF SUMMARY

The present disclosure is directed to a network and method for reducing voltage. In one aspect, an impedance matching network includes an input configured to operably couple to a radio frequency (RF) source; an output configured to operably couple to a load; a first variable capacitor; a second variable capacitor; and a third capacitor in series with the second variable capacitor and reducing a voltage on the second variable capacitor.

In another aspect, an impedance matching network includes an input; an output; a first variable capacitor; a second variable capacitor; and a third capacitor in series with the second variable capacitor; wherein the first variable capacitor has a first capacitance, and the second variable capacitor has second capacitance; and wherein the first capacitance and the second capacitance are configured to be altered to create an impedance match at the input.

In another aspect, a method of matching an impedance includes providing a matching network between an RF source and a load, the matching network comprising an input configured to operably couple to the RF source; an output configured to operably couple to the load; a first variable capacitor; a second variable capacitor; and a third capacitor in series with the second variable capacitor and reducing a voltage on the second variable capacitor; and varying a capacitance of the first variable capacitor or the second variable capacitor to achieve an impedance match.

In yet another aspect, a method of manufacturing a semiconductor includes operably coupling a matching network between an RF source and a plasma chamber, the plasma chamber configured to deposit a material layer onto the substrate or etch a material layer from the substrate, and the matching network comprising an input configured to operably couple to the RF source; an output configured to operably couple to the plasma chamber; a first variable capacitor; a second variable capacitor; and a third capacitor in series with the second variable capacitor and reducing a voltage on the second variable capacitor; placing a substrate in the plasma chamber; energizing plasma within the plasma chamber by coupling RF power from the RF source into the plasma chamber to perform a deposition or etching; and controlling a capacitance of the first variable capacitor or the second variable capacitor to achieve an impedance match.

BRIEF DESCRIPTION OF THE DRAWINGS

The present disclosure will become more fully understood from the detailed description and the accompanying drawings, wherein.

DETAILED DESCRIPTION

Figure 1:
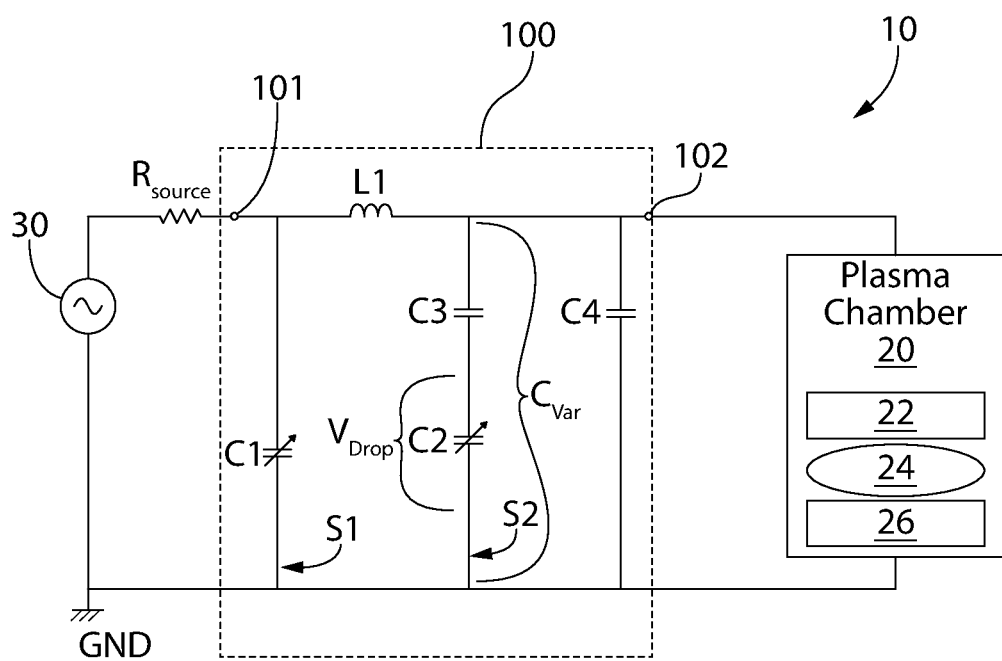
FIG. 1 is a system incorporating a pi matching network according to one embodiment.

The following description of the preferred embodiment(s) is merely exemplary in nature and is in no way intended to limit the invention or inventions. The description of illustrative embodiments is intended to be read in connection with the accompanying drawings, which are to be considered part of the entire written description. In the description of the exemplary embodiments disclosed herein, any reference to direction or orientation is merely intended for convenience of description and is not intended in any way to limit the scope of the present invention. The discussion herein describes and illustrates some possible non-limiting combinations of features that may exist alone or in other combinations of features. Furthermore, as used herein, the term "or" is to be interpreted as a logical operator that results in true whenever one or more of its operands are true.

Features of the present invention may be implemented in software, hardware, firmware, or combinations thereof. The computer programs described herein are not limited to any particular embodiment, and may be implemented in an operating system, application program, foreground or background processes, driver, or any combination thereof. The computer programs may be executed on a single computer or server processor or multiple computer or server processors.

Processors described herein may be any central processing unit (CPU), microprocessor, micro-controller, computational, or programmable device or circuit configured for executing computer program instructions (e.g., code). Various processors may be embodied in computer and/or server hardware of any suitable type (e.g., desktop, laptop, notebook, tablets, cellular phones, etc.) and may include all the usual ancillary components necessary to form a functional data processing device including without limitation a bus, software and data storage such as volatile and non-volatile memory, input/output devices, graphical user interfaces (GUIs), removable data storage, and wired and/or wireless communication interface devices including Wi-Fi, Bluetooth, LAN, etc.

Computer-executable instructions or programs (e.g., software or code) and data described herein may be programmed into and tangibly embodied in a non-transitory computer-readable medium that is accessible to and retrievable by a respective processor as described herein which configures and directs the processor to perform the desired functions and processes by executing the instructions encoded in the medium. A device embodying a programmable processor configured to such non-transitory computer-executable instructions or programs may be referred to as a "programmable device", or "device", and multiple programmable devices in mutual communication may be referred to as a "programmable system." It should be noted that non-transitory "computer-readable medium" as described herein may include, without limitation, any suitable volatile or non-volatile memory including random access memory (RAM) and various types thereof, read-only memory (ROM) and various types thereof, USB flash memory, and magnetic or optical data storage devices (e.g., internal/external hard disks, floppy discs, magnetic tape CD-ROM, DVD-ROM, optical disk, ZIP™ drive, Blu-ray disk, and others), which may be written to and/or read by a processor operably connected to the medium.

In certain embodiments, the present invention may be embodied in the form of computer-implemented processes and apparatuses such as processor-based data processing and communication systems or computer systems for practicing those processes. The present invention may also be embodied in the form of software or computer program code embodied in a non-transitory computer-readable storage medium, which when loaded into and executed by the data processing and communications systems or computer systems, the computer program code segments configure the processor to create specific logic circuits configured for implementing the processes.

In the following description, where circuits are shown and described, one of skill in the art will recognize that, for the sake of clarity, not all peripheral circuits or components are shown in the figures or described in the description.

Referring now to FIG. 1, a system 10 incorporating a pi matching network 100 according to one embodiment is shown. In this embodiment, the system 10 is a system for manufacturing semiconductors. In other embodiments, the matching network can form part of any system attempting to match a source impedance to a load impedance to maximize power transfer to the load.

In the exemplified embodiment, the system 10 includes a radio frequency (RF) source 30 having a substantially fixed output impedance $R_{source}$ (e.g., 50 ohms). The RF source 30 generates an RF signal that is received at the input 101 of the matching network 100. The RF source 30 is also operably coupled to chassis ground GND. The RF source 30 may be an RF generator of a type that is well-known in the art to generate an RF signal at an appropriate frequency and power for the process performed within the load 20. The RF source 30 may be electrically connected to the RF input 101 of the impedance matching network 100 using a coaxial cable or similar means, which for impedance matching purposes may have the same fixed (or substantially fixed) impedance as the RF source 30.

The system 10 further includes a load. In the exemplified embodiment, the load is a plasma chamber 20 for manufacturing a semiconductor. The semiconductor device can be a microprocessor, a memory chip, or another type of integrated circuit or device.

As is known in the art, the plasma within a plasma chamber 20 typically undergoes certain fluctuations outside of operational control so that the impedance presented by the plasma chamber 20 is a variable impedance. Since the variable impedance of the plasma chamber 20 cannot be fully controlled, an impedance matching network may be used to create an impedance match between the plasma chamber 20 and the RF source 30. In other embodiments, the load can be any load of variable impedance that can utilize a matching network.

The plasma chamber 20 can include a first electrode 22 and a second electrode 26, and in processes that are well known in the art, the first and second electrodes, in conjunction with appropriate control systems (not shown) and the plasma in the plasma chamber 120, enable one or both of deposition of materials onto a substrate 24 and etching of materials from the substrate 24. The plasma chamber 20 can receive an RF signal from the output 102 of the matching network 100 and thereby receive RF power from the RF source 30 to energize plasma within the plasma chamber 20 to perform the deposition or etching.

The matching network 100 can consist of a single module within a single housing designed for electrical connection to the RF source 30 and plasma chamber 20. In other embodiments, the components of the matching network 100 can be located in different housings, some components can be outside of the housing, and/or some components can share a housing with a component outside the matching network 100.

The matching network 100 provides impedance matching for the RF source 30 and the plasma chamber 20. The matching network 100 is operably coupled between the RF source 30 and the plasma chamber 20. The matching network 100 includes an input 101 configured to operably couple to the RF source 30, and an output 102 configured to operably couple to the plasma chamber 20. The matching network 100 further includes a first variable capacitor C1 and a second variable capacitor C2. In a preferred embodiment, the variable capacitors C1, C2 are EVCs, though in other embodiments, other types of variable capacitors can be used, such as VVCs.

In this first embodiment, the matching network 100 is a pi network. The first variable capacitor C1 forms part of a first shunt S1 parallel to the RF source 30, and the second variable capacitor C2 forms part of a second shunt S2 separate from the first shunt S1. Put differently, the first variable capacitor C1 is parallel to the input 101, and the second variable capacitor C2 is parallel to the output 102.

Further, a first inductor L1 is located between the first shunt S1 and the second shunt S2. In other embodiments, a second inductor L2 can be located between the second shunt S2 and the output 102.

The first variable capacitor C1 has a first capacitance, and the second variable capacitor C2 has a second capacitance. The first capacitance and the second capacitance are configured to be altered to create an impedance match at the input. As will be discussed further herein, however, the invention is not limited to pi matching networks, as other types of matching networks can be utilized.

To reduce a voltage on the second variable capacitor C2, the matching network 100 further includes a third capacitor C3 in series with the second variable capacitor C2. Components or nodes are said to be "in series" if the same current flows through each. In the exemplified embodiment, the third capacitor C3 forms part of the second shunt S2, though the invention is not so limited. In other embodiments, the third capacitor C3 can be at different locations, provided the third capacitor C3 is positioned to reduce a voltage on the second variable capacitor C2 (the reduced voltage being, for example, an alternating current or radio frequency voltage). Alternative embodiments are discussed below. In the embodiments discussed, the third or additional capacitor is a non-variable capacitor, though in other embodiments a variable capacitor can be used.

In the exemplified embodiment, a fourth capacitor C4 is included. The fourth capacitor C4 is parallel to the second shunt S2 and helps to offset the total capacitance. In other embodiments, the fourth capacitor C4 can be omitted.

Figure 2:
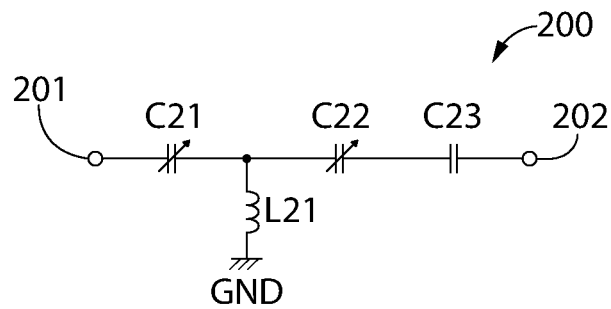
FIG. 2 is a T matching network according to one embodiment.

FIG. 2 is a T matching network 200 according to a second embodiment. The matching network 200 includes an input 201 configured to operably couple to an RF source and an output 202 configured to operably couple to a load. A first variable capacitor C21 is in series with the input 201, and a second variable capacitor C22 is in series with the output 202. An inductor L21 at one end is coupled at a node between the two variable capacitors C21, C22 and coupled at another end to chassis ground. As with the first embodiment, the third capacitor C23 is in series with the second variable capacitor C22 to reduce a voltage on the second variable capacitor C22.

Figure 3:
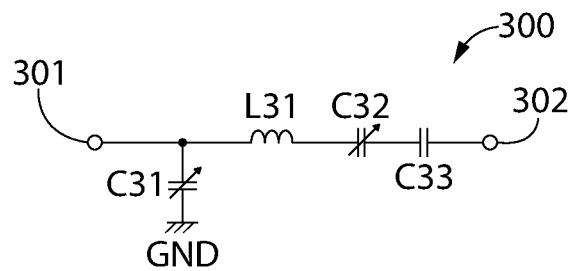
FIG. 3 is an L matching network according to one embodiment.

FIG. 3 is an L matching network 300 according to a third embodiment. The matching network 300 includes an input 301 configured to operably couple to an RF source and an output 302 configured to operably couple to a load. A first variable capacitor C31 is parallel to the input 301. Further, a second variable capacitor C32 is in series with the output 302. Further, an inductor L31 is in series with the output 302. As with the first embodiment, the third capacitor C33 is in series with the second variable capacitor C32 to reduce a voltage on the second variable capacitor C32.

Figure 4:
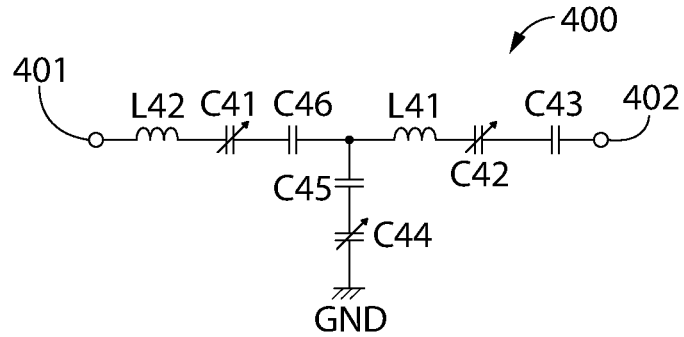
FIG. 4 is a T-variation matching network according to one embodiment.

FIG. 4 is a matching network 400 that is a variation on a T matching network according to a fourth embodiment. The matching network 400 includes an input 401 configured to operably couple to an RF source and an output 402 configured to operably couple to a load. A first variable capacitor C41 is in series with the input 401, a second variable capacitor C42 is in series with the output 202, and another variable capacitor C44 at one end is coupled at a node between the two variable capacitors C41, C42 and coupled at another end to chassis ground. Further, capacitor C46 is in series with capacitor C41, capacitor C43 is in series with capacitor C42, and capacitor C45 is in series with capacitor C44. An inductor L41 is in series with the output 402, and an inductor L42 is in series with the input 401. As with the first embodiment, the third capacitor C43 reduces a voltage on the second variable capacitor C42. Further, capacitors C41 and C45 reduce voltage on capacitors C46 and C44, respectively.

Figure 5:
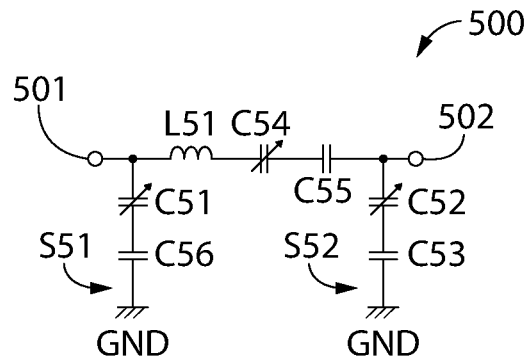
FIG. 5 is a pi-variation matching network according to one embodiment.

FIG. 5 is a matching network 500 that is a variation on a pi matching network according to a fifth embodiment. The matching network 500 includes an input 501 configured to operably couple to an RF source and an output 502 configured to operably couple to a load. A first variable capacitor C51 forms part of a first shunt S51 parallel to the input 501, a second variable capacitor C52 forms part of a second shunt S52 separate from and parallel to the output 502, and another variable capacitor C54 is located between variable capacitors C51 and C52. Capacitor C56 is in series with variable capacitor C51, capacitor C53 is in series with variable capacitor C52, and capacitor C55 is in series with variable capacitor C54. Further, a first inductor L51 is in series with variable capacitor C54. As with the first embodiment, the third capacitor C53 reduces a voltage on the second variable capacitor C52. Further, capacitors C55 and C56 reduce a voltage on variable capacitors C54 and C51, respectively.

Figure 6:
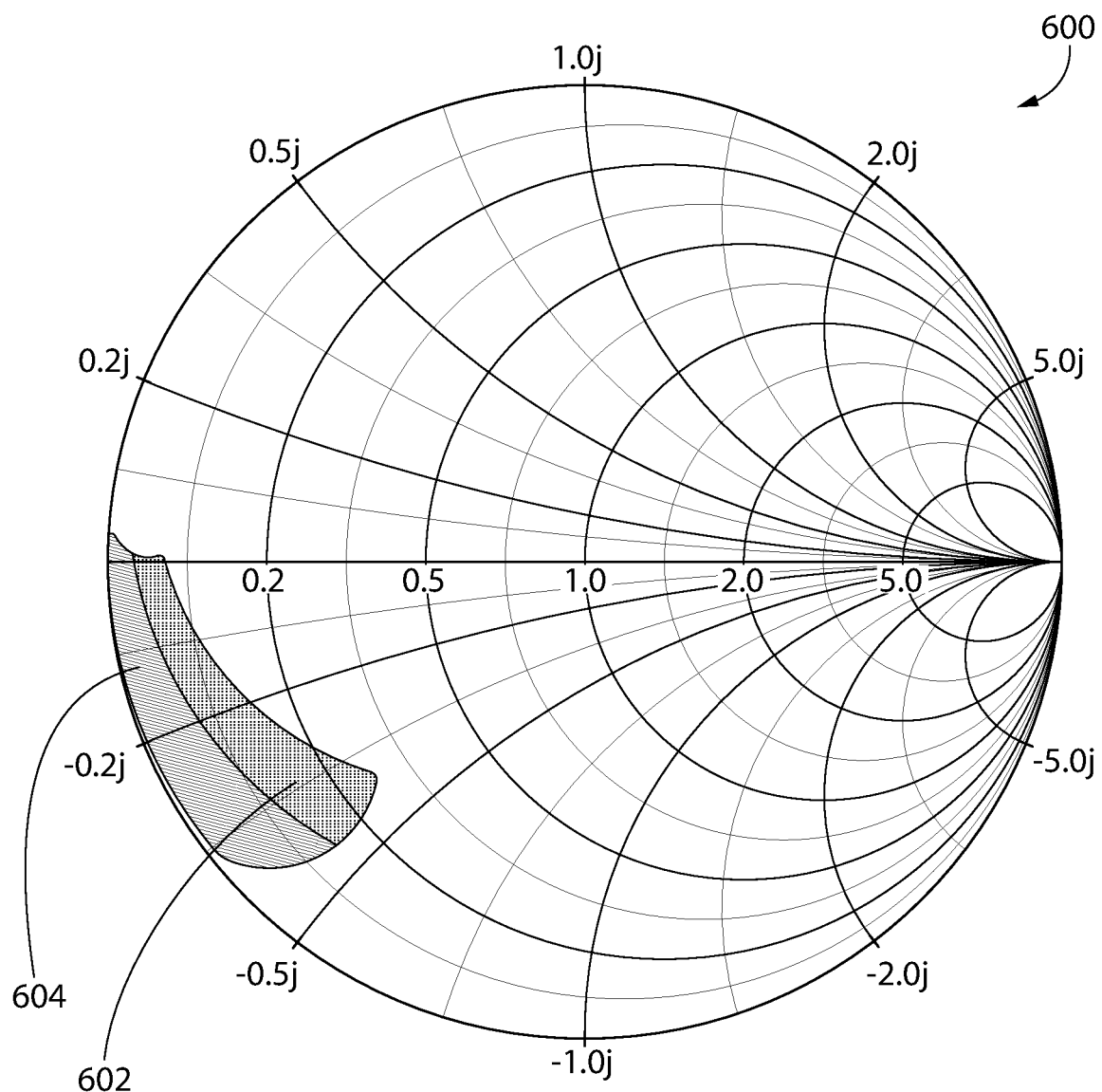
FIG. 6 is an impedance Smith chart for the pi matching network of FIG. 1 where capacitor C3 is omitted.

FIG. 6 shows an impedance Smith chart 600 for the matching network of FIG. 1 before the additional capacitor C3 is added. An impedance Smith chart shows the different possible impedances for a matching network. In FIG. 6, the first region 602 and the second region 604 together represent the total number of possible impedances. There is a maximum voltage across C2 (e.g., 1600V). The first region 601 represents the impedance range where the maximum voltage is not exceeded (within spec), and the second region 602 represents the impedance range where the maximum voltage is exceeded (out of spec). It can be seen that about half of the impedance range of the matching network cannot be used at full power due to over voltage.

In the embodiment discussed below, the values of the additional fixed capacitor C3 and variable capacitors C2 (see FIG. 1) are chosen to reduce the voltage $V_{Drop}$ on the variable capacitor C2 by half at the maximum capacitance (compared to the voltage on the variable capacitor C2 without the presence of the additional capacitor C3). This is only an example, and the voltage drop can be altered depending on the application, the desired voltage drop, and/or the availability of components.

The voltage drop $V_{Drop}$ across the variable capacitor C2 (see FIG. 1) can be calculated by the following equation:

$$V_{Drop} = V_{C2}^* \frac{1}{C} \Big/ \left(\frac{1}{C2} + \frac{1}{C3}\right)$$

If $C2_{Max}=C3$, then the formula can be simplified as below, where $C2_{Max}=C3=C$.

$$V_{Drop} = V_{C2}^* \frac{1}{C} \Big/ \left(\frac{1}{C} + \frac{1}{C}\right) = V_{C2}^* 1/(1+1) = \frac{V_{C2}}{2}$$

As a result, $V_{Drop}$ is equal to half of the voltage that was originally capacitor C2 ($V_{C2}$) when C3 was not included.

$$V_{Drop} = \frac{V_{C2}}{2}$$

Continuing with this example, the next step is to find the maximum capacitance required for the variable and fixed capacitors. In this case, the total series capacitance CVar is equal to the maximum capacitance of the original variable capacitor C2. The capacitance CVar can be calculated by the following equation:

$$CVar_{Max} = \left(\frac{1}{C2_{Max}} + \frac{1}{C3}\right)^{-1}$$

If $C2_{Max}=C3=C$, the equation can be modified as follows:

$$\frac{1}{CVar_{Max}} = \left(\frac{1}{C} + \frac{1}{C}\right) = \frac{2}{C}$$

C is then solved for as follows:

$$C = 2*CVar_{Max}$$

The minimum value for variable capacitor C2, $C2_{Min}$, can be found by using the previously calculated value for C3 and replacing the $CVar_{Max}$ with the minimum capacitance, $CVar_{Min}$, as in the following equations:

$$\frac{1}{C2_{Min}} = \left(\frac{1}{CVar_{Min}} - \frac{1}{C3}\right)$$

$$C2_{Min} = \left(\frac{1}{CVar_{Min}} - \frac{1}{C3}\right)^{-1}$$

Figure 7:
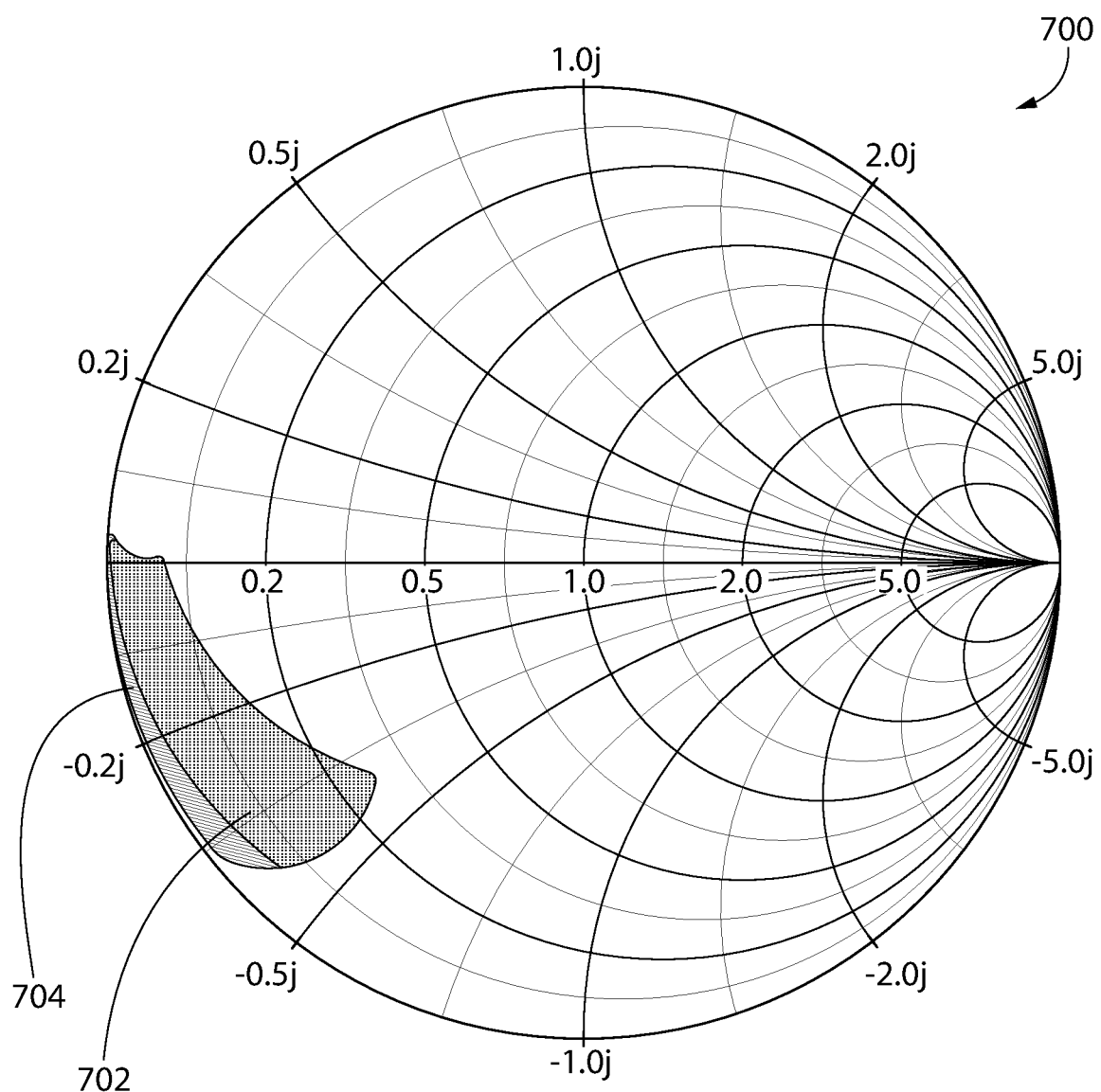
FIG. 7 is an impedance Smith chart for the pi matching network of FIG. 1 where $C3=C2_{Max}$.

FIG. 7 is an impedance Smith chart 700 where third capacitor C3 is set to the maximum capacitance of second capacitor C2 ($C3=C2_{Max}$). It is shown that the usable range of the matching network (represented by first region 702) has been increased, and the unusable range (represented by second region 704) has been decreased, without sacrificing the impedance range, using a more expensive, larger, higher voltage component, or adding more peripheral components to meet the voltage requirements.

It can also be seen, however, that the first (usable) region 702 has gaps representing areas where a perfect impedance match is not provided. This can be a result of adding capacitor C3 to reduce the voltage, which increases the gap between the quantized states of the variable capacitor when approaching $C2_{Min}$ and decreased the spacing when approaching $C2_{Max}$.

Figure 8:
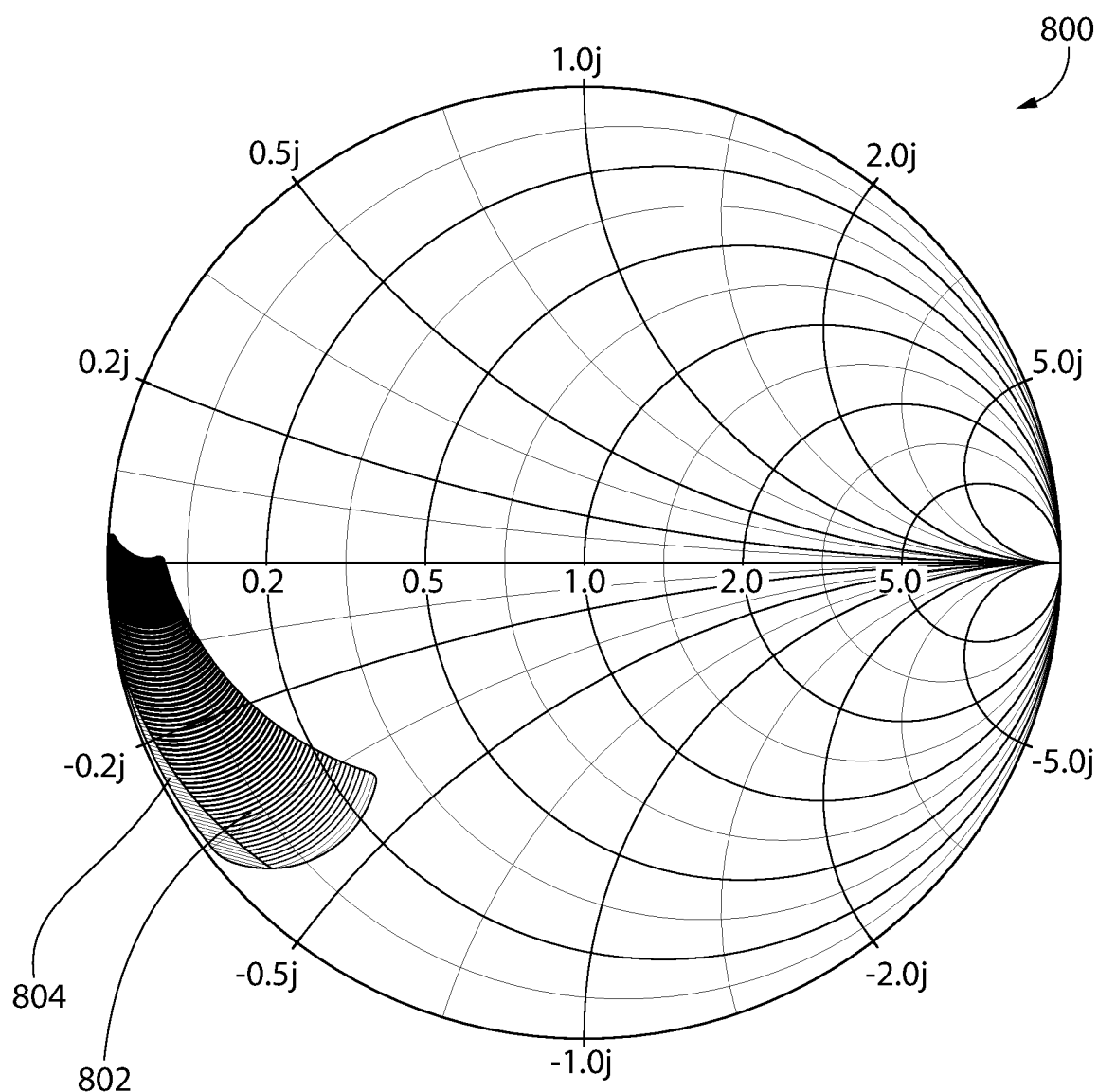
FIG. 8 is an impedance Smith chart for the pi matching network of FIG. 1 where $C3=C2_{Min}$.

FIG. 8 is an impedance Smith chart 800 where third capacitor C3 is set to the minimum capacitance of second capacitor C2 ($C3=C2_{Min}$). It is shown that such an arrangement can further increase the usable range (first region 802) of the matching network, and decrease the unusable range (second region 804). C3 can be reduced further, but there is a limit before it affects the maximum capacitance range. To avoid this, each of C3 and $C2_{Max}$ can be greater than $CVar_{Max}$. This is also true if using two or more variable capacitors in series. Thus, if C1 was replaced with C15 and C16, then $C15_{Max}$ and $C16_{Max}$ can be selected to each be greater than $C1_{Max}$. $C1_{Max}$ can be calculated using the following equation:

$$C1_{Max} = \left(\frac{1}{C15_{Max}} + \frac{1}{C16_{Max}}\right)^{-1}$$

Figure 9:
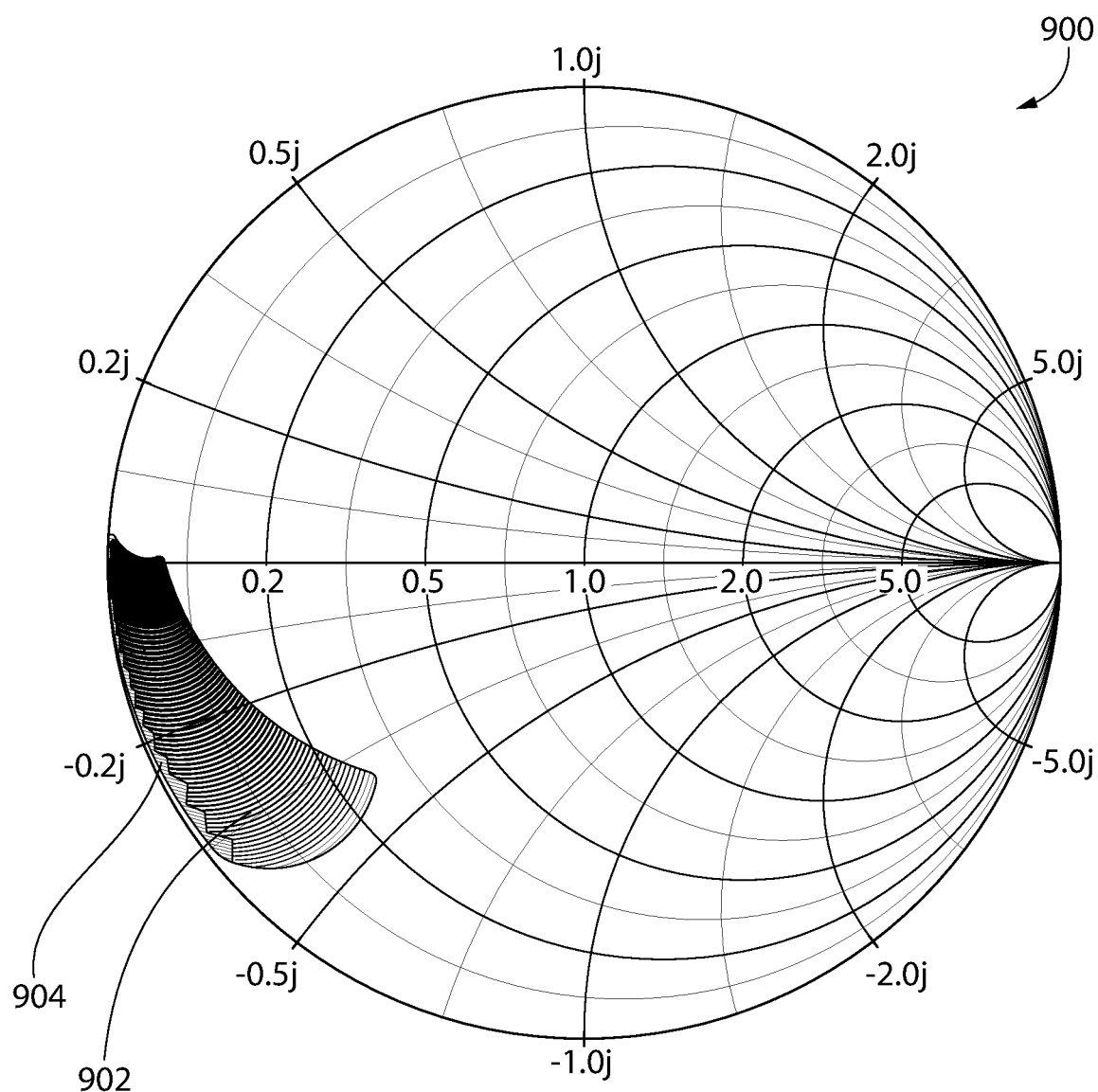
FIG. 9 is an impedance Smith chart for the pi matching network of FIG. 1 where C3 is replaced with a variable capacitor.

The addition of a third variable or non-variable capacitor, to help further reduce $V_{Drop}$, can change the capacitor range of the variable capacitor combination C2. To address this, a variable capacitor such as an EVC can be easily modified to adjust the capacitor range. The third capacitor can also change the step sizes and make them nonlinear. In certain embodiments, a more uniform distribution can be provided by using a nonlinear variable capacitor or multiple variable capacitors in series. FIG. 9 is an impedance Smith chart 900 where the third capacitor C3 is replaced with a variable capacitor. This figure shows the usable range (first region 902) of the matching network, and the unusable range (second region 904).

In other embodiments, transmission lines (which can comprise microstrips, coaxial cable, a wave guide, or any other conductive medium) can be used to rotate the impedance of the matching network on the Smith chart. The length of the transmission line at a certain frequency determines the amount of rotation. The longer the transmission line, the more rotation there will be on the Smith chart. A quarter wavelength ($\lambda/4$) transmission line (which can be calculated using the operating frequency and the property of the dielectric material) will have a 180° clockwise rotation on the Smith chart, a half wavelength ($\lambda/2$) transmission line will have a 360° clockwise rotation on the Smith chart, an eighth wavelength ($\lambda/8$) would be equal to 45°, and so on.

Figure 10:
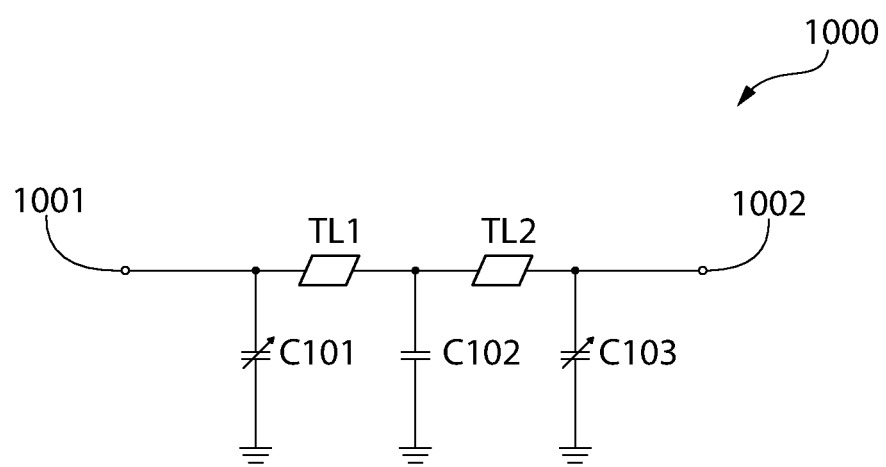
FIG. 10 is matching network using transmission lines to rotate the impedance.

If the matching network 1000 uses only quarter wave lines, or something that would ultimately give a 90° phase shift [($\lambda/4$)+N*($\lambda/2$)], and there are the three capacitors C101, C102, C103 in shunt (together with transmission lines TL1 and TL2), as shown in FIG. 10, the circuit can be equivalent to a low pass pi matching network, with input 1001 and output 1002. Two variable capacitors can be used with a single transmission line between to create the equivalent of an L-type matching network (e.g., C101-TL1-C102 of FIG. 10). Transmission lines can then be added to the input port, the output port or both ports to create the equivalent inverse network of the two previously mentioned matching networks. In other embodiments, other topologies can be created with other transmission lines.

Figure 11:
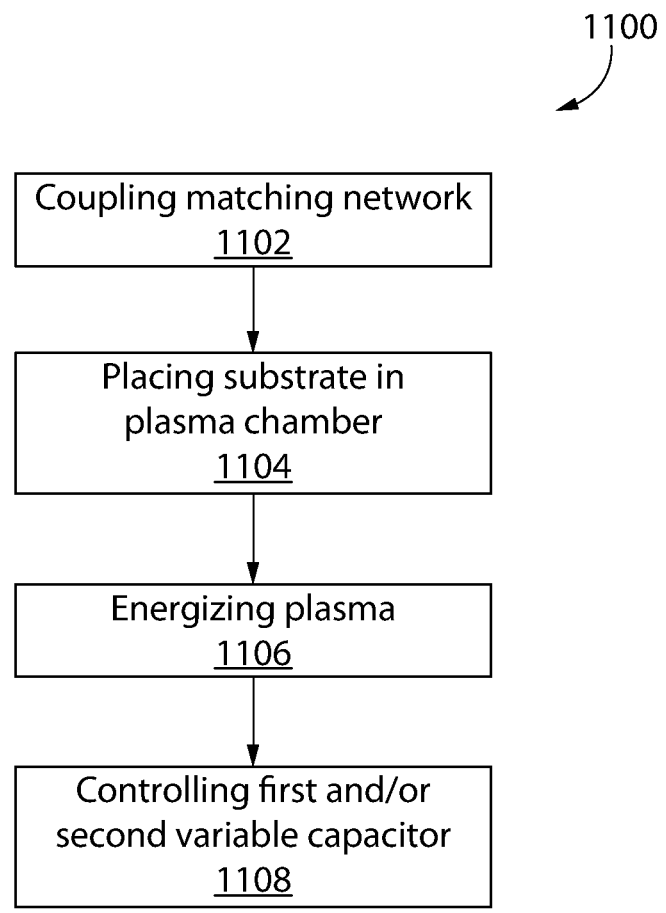
FIG. 11 is a flowchart of a method of manufacturing a semiconductor according to one embodiment.

FIG. 11 is a flowchart of a method 1100 of manufacturing a semiconductor according to one embodiment. In the exemplified embodiment, a matching network is operably coupled between an RF source and a plasma chamber (operation 1102), as in the embodiment of the system 10 shown in FIG. 1. The matching network can be configured to have the features of any of the embodiments discussed herein. Further, the method 1100 can include placing a substrate in the plasma chamber (operation 1104). Further, the method 1100 can include energizing plasma within the plasma chamber by coupling RF power from the RF source into the plasma chamber to perform a deposition or etching (operation 1106). Further, the method 1100 can include controlling a capacitance of the first variable capacitor and/or the second variable capacitor to achieve an impedance match (operation 1108).

The foregoing embodiments provide several advantages. The embodiments disclose a matching network that can more effectively handle high voltages generated in a network. Further, the embodiments avoid or minimize the need for increased component sizes (as typically required for a VVC) or increased numbers of peripheral components (as typically required with an EVC). Further, the embodiments provide a solution that has a lower cost than previous methods of addressing high voltages in a matching network. As shown herein, the embodiments can increase the usable range of a matching network without sacrificing the impedance range, using a more expensive, larger, higher voltage component, or adding more peripheral components to meet the voltage requirements.

While the invention or inventions have been described with respect to specific examples, those skilled in the art will appreciate that there are numerous variations and permutations of the above described invention(s). It is to be understood that other embodiments may be utilized and structural and functional modifications may be made without departing from the scope of the present invention(s). Thus, the spirit and scope should be construed broadly as set forth in the appended claims.

What is claimed is:

1. An impedance matching network comprising:
an input configured to operably couple to a radio frequency (RF) source;
an output configured to operably couple to a load;
a first variable capacitor;
a second variable capacitor comprising discrete capacitors coupled parallel to one another, each discrete capacitor having a corresponding switch in series with the discrete capacitor to switch the discrete capacitor in when closed and out when open, wherein the second variable capacitor has a minimum capacitance when each switch is open and a maximum capacitance when each switch is closed; and
a third capacitor in series with the second variable capacitor and reducing a voltage across each of the switches of the second variable capacitor;
wherein each of the first variable capacitor and the second variable capacitor is coupled to a common ground with no capacitor between the first variable capacitor and the common ground, and no capacitor between the second variable capacitor and the common ground;
wherein the second variable capacitor and the third capacitor form part of a shunt that is connected directly to the output of the matching network; and wherein a fourth capacitor is connected directly to the output of the matching network and is parallel to the shunt.

2. The network of claim 1 wherein the load is a plasma chamber.

3. The network of claim 2 wherein the third capacitor is a non-variable capacitor.

4. The network of claim 3 wherein the first and second variable capacitors are electronically variable capacitors.

5. The network of claim 1 wherein:
the first variable capacitor forms part of a first shunt parallel to the RF source; and
the shunt comprising the second variable capacitor and the third capacitor is a second shunt parallel to the load.

6. The network of claim 5 further comprising a fourth capacitor parallel to the second shunt.

7. The network of claim 1 wherein the voltage on the second variable capacitor when the third capacitor is present is half or less than half of a voltage on the second variable capacitor when the third capacitor is not present.

8. The network of claim 1 wherein a capacitance value of the third capacitor is equal to a maximum capacitance value of the second capacitor.

9. The network of claim 1 wherein a capacitance value of the third capacitor is equal to a minimum capacitance value of the second capacitor.

10. An impedance matching network comprising:
an input;
an output;
a first variable capacitor;

a second variable capacitor comprising discrete capacitors coupled parallel to one another, each discrete capacitor having a corresponding switch in series with the discrete capacitor to switch the discrete capacitor in when closed and out when open, wherein the second variable capacitor has a minimum capacitance when each switch is open and a maximum capacitance when each switch is closed; and a third capacitor in series with the second variable capacitor and reducing a voltage across each of the switches of the second variable capacitor;

wherein the first variable capacitor has a first capacitance, and the second variable capacitor has second capacitance;

wherein the first capacitance and the second capacitance are configured to be altered to create an impedance match at the input; and wherein each of the first variable capacitor and the second variable capacitor is coupled to a common ground with no capacitor between the first variable capacitor and the common ground, and no capacitor between the second variable capacitor and the common ground;

wherein the second variable capacitor and the third capacitor form part of a shunt that is connected directly to the output of the matching network; and wherein a fourth capacitor is connected directly to the output of the matching network and is parallel to the shunt.

11. The network of claim 10 wherein:
the first variable capacitor forms part of a first shunt parallel to the RF source; and
the shunt comprising the second variable capacitor and the third capacitor is a second shunt parallel to the load.

12. The network of claim 11 further comprising a first inductor is located between the first shunt and the second shunt.

13. The network of claim 10 wherein a voltage drop on the second variable capacitor when the third capacitor is present is less than a voltage drop on the variable capacitors when the third capacitor is not present.

14. The network of claim 10 wherein a capacitance value of the third capacitor is equal to a maximum capacitance value of the second capacitor.

15. The network of claim 10 wherein a capacitance value of the third capacitor is equal to a minimum capacitance value of the second capacitor.

16. A method of manufacturing a semiconductor comprising:
operably coupling a matching network between an RF source and a plasma chamber, the plasma chamber configured to deposit a material layer onto the substrate or etch a material layer from the substrate, and the matching network comprising:
an input configured to operably couple to the RF source;
an output configured to operably couple to the plasma chamber;
a first variable capacitor;
a second variable capacitor comprising discrete capacitors coupled parallel to one another, each discrete capacitor having a corresponding switch in series with the discrete capacitor to switch the discrete capacitor in when closed and out when open, wherein the second variable capacitor has a minimum capacitance when each switch is open and a maximum capacitance when each switch is closed; and a third capacitor in series with the second variable capacitor and reducing a voltage across each of the switches of the second variable capacitor, wherein each of the first variable capacitor and the second variable capacitor is coupled to a common ground with no capacitor between the first variable capacitor and the common ground, and no capacitor between the second variable capacitor and the common ground, wherein the second variable capacitor and the third capacitor form part of a shunt that is connected directly to the output of the matching network; wherein a fourth capacitor is connected directly to the output of the matching network and is parallel to the shunt;

placing a substrate in the plasma chamber;
energizing plasma within the plasma chamber by coupling RF power from the RF source into the plasma chamber to perform a deposition or etching; and
controlling a capacitance of the first variable capacitor or the second variable capacitor to achieve an impedance match.

17. The method of claim 16 wherein:
the first variable capacitor forms part of a first shunt parallel to the RF source; and
the shunt comprising the second variable capacitor and the third capacitor is a second shunt parallel to the load.

18. A semiconductor processing tool comprising:
a plasma chamber configured to deposit a material onto a substrate or etch a material from the substrate; and
an impedance matching circuit operably coupled to the plasma chamber, matching circuit comprising:
an input configured to operably couple to a radio frequency (RF) source;
an output configured to operably couple to a load;
a first variable capacitor;
a second variable capacitor comprising discrete capacitors coupled parallel to one another, each discrete capacitor having a corresponding switch in series with the discrete capacitor to switch the discrete capacitor in when closed and out when open, wherein the second variable capacitor has a minimum capacitance when each switch is open and a maximum capacitance when each switch is closed; and
a third capacitor in series with the second variable capacitor and reducing a voltage across each of the switches of the second variable capacitor;
wherein each of the first variable capacitor and the second variable capacitor is coupled to a common ground with no capacitor between the first variable capacitor and the common ground, and no capacitor between the second variable capacitor and the common ground;
wherein the second variable capacitor and the third capacitor form part of a shunt that is connected directly to the output of the matching network; and wherein a fourth capacitor is connected directly to the output of the matching network and is parallel to the shunt.

19. A method of matching an impedance comprising:
providing a matching network between an RF source and a load, the matching network comprising:
an input configured to operably couple to the RF source;
an output configured to operably couple to the load;
a first variable capacitor;

a second variable capacitor comprising discrete capacitors coupled parallel to one another, each discrete capacitor having a corresponding switch in series with the discrete capacitor to switch the discrete capacitor in when closed and out when open, wherein the second variable capacitor has a minimum capacitance when each switch is open and a maximum capacitance when each switch is closed; and a third capacitor in series with the second variable capacitor and reducing a voltage across each of the switches of the second variable capacitor, wherein each of the first variable capacitor and the second variable capacitor is coupled to a common ground with no capacitor between the first variable capacitor and the common ground, and no capacitor between the second variable capacitor and the common ground, wherein the second variable capacitor and the third capacitor form part of a shunt that is connected directly to the output of the matching network; wherein a fourth capacitor is connected directly to the output of the matching network and is parallel to the shunt; and varying a capacitance of the first variable capacitor or the second variable capacitor to achieve an impedance match.

* * * * *